_

US012104108B2

(12) United States Patent
Takahashi et al.

(10) Patent No.: US 12,104,108 B2
(45) Date of Patent: *Oct. 1, 2024

(54) ETCHING COMPOSITIONS

(71) Applicant: Fujifilm Electronic Materials U.S.A., Inc., N. Kingstown, RI (US)

(72) Inventors: Tomonori Takahashi, Shizuoka (JP); Frank Gonzalez, Mesa, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/102,961

(22) Filed: Nov. 24, 2020

(65) Prior Publication Data

US 2021/0102121 A1    Apr. 8, 2021

Related U.S. Application Data

(62) Division of application No. 16/541,787, filed on Aug. 15, 2019, now Pat. No. 10,961,453.

(60) Provisional application No. 62/730,043, filed on Sep. 12, 2018.

(51) Int. Cl.
| C09K 13/06 | (2006.01) |
| C09K 13/00 | (2006.01) |
| C23F 1/10 | (2006.01) |
| C23F 1/44 | (2006.01) |
| H01L 21/02 | (2006.01) |
| H01L 21/3213 | (2006.01) |

(52) U.S. Cl.
CPC .............. C09K 13/06 (2013.01); C09K 13/00 (2013.01); C23F 1/10 (2013.01); C23F 1/44 (2013.01); H01L 21/02068 (2013.01); H01L 21/32134 (2013.01)

(58) Field of Classification Search
CPC . C09K 13/06; C09K 13/00; C23F 1/10; C23F 1/44; H01L 21/02068; H01L 21/32134
USPC ......................... 252/79.1–79.4; 438/745, 754
See application file for complete search history.

(56) References Cited

U.S. PATENT DOCUMENTS

| 4,124,516 A | 11/1978 | Shinozaki et al. |
| 5,639,344 A * | 6/1997 | Konuma ........... H01L 29/66757 |
| | | 438/585 |
| 6,369,410 B1 | 4/2002 | Yamazaki et al. |
| 6,489,241 B1 | 12/2002 | Thilderkvist et al. |
| 9,062,244 B2 | 6/2015 | Park et al. |
| 10,961,453 B2 * | 3/2021 | Takahashi ........... C23F 1/44 |
| 2003/0022518 A1 | 1/2003 | Munakata et al. |
| 2006/0073088 A1 | 4/2006 | Ishikawa et al. |
| 2009/0227075 A1 | 9/2009 | Kim et al. |
| 2010/0033670 A1 | 2/2010 | Fujita et al. |
| 2011/0230053 A1 * | 9/2011 | Matsuda ................... C23F 1/44 |
| | | 252/79.1 |
| 2011/0253668 A1 | 10/2011 | Winoto et al. |
| 2012/0086014 A1 * | 4/2012 | Kim ........................ H01L 28/90 |
| | | 257/E23.01 |
| 2012/0295447 A1 | 11/2012 | Tamboli et al. |
| 2013/0015471 A1 | 1/2013 | Park et al. |
| 2013/0228220 A1 | 9/2013 | Schum et al. |
| 2014/0097006 A1 | 4/2014 | Park et al. |
| 2015/0159125 A1 | 6/2015 | Kneer |
| 2015/0200112 A1 * | 7/2015 | Han ........................ C23F 1/26 |
| | | 438/478 |
| 2015/0206963 A1 * | 7/2015 | Ho ..................... H01L 29/66545 |
| | | 257/411 |
| 2016/0053386 A1 | 2/2016 | Mizutani et al. |
| 2016/0200975 A1 * | 7/2016 | Cooper ............. H01L 21/31111 |
| | | 216/13 |
| 2018/0148645 A1 | 5/2018 | Lee et al. |
| 2020/0079998 A1 | 3/2020 | Takahashi et al. |

FOREIGN PATENT DOCUMENTS

| CN | 1399317 | 2/2003 |
| CN | 1501176 | 6/2004 |
| CN | 1966772 | 5/2007 |
| CN | 103572292 | 2/2014 |
| CN | 105755472 | 7/2016 |
| CN | 105463463 | 4/2018 |
| CN | 108265296 | 7/2018 |
| GB | 174489 | 2/1922 |
| JP | 2004221261 A * | 8/2004 ............... G09G 1/02 |
| JP | 2005-022919 | 3/2006 |
| JP | 2006-339635 | 12/2006 |
| JP | 2012-028393 | 2/2012 |
| JP | 2014-093407 | 5/2014 |
| JP | 2014-232872 | 12/2014 |
| JP | 2016-022477 | 2/2016 |
| JP | 2016-167581 | 9/2016 |
| JP | 2017-92439 | 5/2017 |

(Continued)

OTHER PUBLICATIONS

CK Ge et al., Versum Materials Technology LLC, "Development of Wet-etch Chemistries for Tungsten Word-line Recess", 2018 Surface Preparation and Cleaning Conference, Boston, MA, Apr. 9-11, 2018, 15 pages.

(Continued)

*Primary Examiner* — Duy Vu N Deo

(74) *Attorney, Agent, or Firm* — Fish & Richardson P.C.

(57) ABSTRACT

The present disclosure is directed to etching compositions that are useful, e.g., for selectively removing tungsten (W) and/or titanium nitride (TiN) from a semiconductor substrate as an intermediate step in a multistep semiconductor manufacturing process.

23 Claims, No Drawings

(56) References Cited

FOREIGN PATENT DOCUMENTS

| | | | | |
|---|---|---|---|---|
| KR | 10-2007-0108643 | | 11/2007 | ............ C09K 13/06 |
| KR | 1020130049506 | * | 5/2013 | ............ C09K 13/08 |
| KR | 10-1361839 | | 2/2014 | ............... C23F 1/44 |
| KR | 20130046065 A | * | 2/2014 | ............... C23F 1/02 |
| KR | 20150050278 A | * | 5/2015 | ............ C09K 13/00 |
| KR | 10-2016-0084284 | | 7/2016 | |
| KR | 1020170006480 | * | 1/2017 | ............ G09K 13/04 |
| KR | 20180060489 A | * | 6/2018 | ....... H01L 21/67075 |
| TW | 201128276 | | 8/2011 | |
| TW | 201809356 | | 3/2018 | |
| TW | 201812102 | | 4/2018 | |
| WO | WO-2013021296 A1 | * | 2/2013 | ............... G09G 1/04 |
| WO | WO 2015/111684 | | 6/2015 | |
| WO | WO 2018/008745 | | 11/2018 | |

OTHER PUBLICATIONS

The International Search Report and Written Opinion of the International Searching Authority for International Application No. PCT/US19/45631 dated Oct. 18, 2019.

Goetting et al., "Microcontact Printing of Alkanephosphonic Acids on Aluminum: Pattern Transfer by Wet Chemical Etching", *Langmuir*, vol. 15, No. 4, pp. 1182-1191 (Jan. 13, 1999).

Supplementary European Search Report for Application No. EP 19 86 0312, dated Oct. 1, 2021.

Communication issued by the European Patent Office for Application No. EP 19 860 312.8, dated Aug. 9, 2022.

Office Action in Chinese Appln. No. 201980062902.9, dated Nov. 3, 2022, 37 pages (with English translation).

Office Action in Taiwan Appln. No. 108128947, dated Mar. 23, 2023, 16 pages (with English translation).

Office Action in Chinese Appln. No. 201980062902.9, dated Jul. 15, 2023, 40 pages (with English translation).

Office Action in Japanese Appln. No. 2021-513969, dated Aug. 29, 2023, 14 pages (with English translation).

Decision to Grant in European Appln. No. 19860312.8, dated Dec. 7, 2023, 2 pages.

Office Action in Chinese Appln. No. 201980062902.9, dated Dec. 14, 2023, 51 pages (with English translation).

Office Action in Chinese Appln. No. 201980062902.9, dated Mar. 14, 2024, 8 pages (with English translation).

Office Action in Korean Appln. No. 10-2021-7010692, dated Jul. 15, 2024, 17 pages (with English translation).

* cited by examiner

ETCHING COMPOSITIONS

CROSS-REFERENCE TO RELATED APPLICATIONS

The present application is a division of and claims priority under 35 U.S.C. § 120 to U.S. application Ser. No. 16/541,787, filed on Aug. 15, 2019, which claims priority to U.S. Provisional Application Ser. No. 62/730,043, filed on Sep. 12, 2018. The entire contents of each of the above priority applications are incorporated herein by reference.

FIELD OF THE DISCLOSURE

The present disclosure relates to compositions and processes to selectively etch aluminum oxide (AlOx such as $Al_2O_3$), tungsten (W) and/or titanium nitride (TiN) in the presence of other exposed or underlying materials, such as metal conductors, barrier materials, insulator materials (e.g., high-k dielectric materials).

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, NAND flash memory and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which could be tolerated before can no longer be tolerated or have become more of an issue due to the smaller feature size.

In the production of advanced integrated circuits, to minimize problems associated with the higher density and to optimize performance, both high-k and low-k insulators, and assorted barrier layer materials have been employed.

Aluminum oxide (AlOx such as $Al_2O_3$), Tungsten (W) and titanium nitride (TiN) are utilized for semiconductor devices, liquid crystal displays, NAND flash memory, MEMS (Micro Electro Mechanical Systems), printed wiring boards and the Ike, and as ground layers and cap layers for precious metal. In semiconductor devices, W and TiN can be used as a barrier metal, a hard mask, or a gate material, and AlOx can be used as a dielectric material.

In the construction of devices for these applications, AlOx, W and TiN frequently need to be etched in same etching step. In the various types of uses and device environments of AlOx, W and TiN, other layers are in contact with or otherwise exposed at the same time as these materials are etched. Highly selective etching of the AlOx, W and TiN in the presence of these other materials (e.g. metal conductors, dielectric, and hard marks) is required for device yield and long life. The etching process for the AlOx, W and TiN may be a plasma etching process. However, using a plasma etching process on the AlOx, W and TiN layer may cause damage to either or both the gate insulating layer and the semiconductor substrate. In addition, the etching process may remove a portion of the semiconductor substrate by etching the gate insulating layer exposed by the gate electrode. The electrical characteristics of the transistor may be negatively impacted. To avoid such etching damage, additional protective device manufacturing steps may be employed, but at a significant cost.

Wet etching methods for AlOx, W and TiN are known. Such methods may include use of etchants in combination with other reagents. However, the selectivity with silicon based dielectrics and other high-k dielectric materials (HfOx) is not sufficient and other exposed metals in the device may also undergo corrosion or etching.

Thus, there is a need for etching solutions that have high AlOx, W or TiN etch rate, but have low etch and corrosion rates for other semiconductor materials which are exposed or in contact with the AlOx, W or TiN during the etching process.

SUMMARY OF THE DISCLOSURE

The present disclosure relates to compositions and processes for selectively etching AlOx, W and/or TiN relative to metal conductor layers, hard mask layers and low-k dielectric layers that are present in the semiconductor device. More specifically, the present disclosure relates to compositions and processes for selectively etching AlOx relative to W and/or TiN, and/or those for selectively etching W and/or TiN relative to certain high-k and/or low-k dielectric layers.

In one aspect, the disclosure features an etching composition that includes a) phosphoric acid in an amount of from about 65 wt % to about 90 wt % of the composition; b) acetic acid in an amount of from about 0.01 wt % to about 4 wt % of the composition; c) nitric acid in an amount of from about 0.01 wt % to about 5 wt % of the composition; and d) water.

In another aspect, the disclosure features a method that includes contacting a semiconductor substrate containing AlOx, W and/or TiN with an etching composition described herein to remove the AlOx, W and/or TiN.

In still another aspect, the disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition. Unless otherwise noted, ambient temperature is defined to be between about 16 and about 27 degrees Celsius (° C.).

In general, the disclosure features etching compositions (e.g., an etching composition for selectively removing tungsten and/or titanium nitride) that includes (e.g., comprises, consists essentially of, or consist of) (a) phosphoric acid in an amount of from about 65 wt % to about 90 wt % of the composition; (b) acetic acid in an amount of from about 0.01 wt % to about 4 wt % of the composition; (c) nitric acid in an amount of from about 0.01 wt % to about 5 wt % of the composition; and (d) water. In some embodiments, the etching compositions can consist of phosphoric acid, acetic acid, nitric acid, or consist of phosphoric acid, acetic acid, nitric acid, and water.

In some embodiments, the phosphoric acid is in an amount of at least about 65 wt % (e.g., at least about 66 wt %, at least about 67 wt %, at least about 68 wt %, at least about 69 wt %, at least about 70 wt %, at least about 71 wt %, at least about 72 wt %, at least about 73 wt %, at least about 74 wt %, at least about 75 wt %, at least about 80 wt %, or at least about 85 wt %) to at most about 90 wt % (e.g., at most about 89 wt %, at most about 88 wt %, at most about 87 wt %, at most about 86 wt %, at most about 85 wt %, at most about 84 wt %, at most about 83 wt %, at most about 82 wt %, at most about 81 wt %, at most about 80 wt %, at most about 79 wt %, at most about 78 wt %, at most about 77 wt %, at most about 76 wt %, or at most about 75 wt %) of the etching compositions of this disclosure. Without wishing to be bound by theory, it is believed that phosphoric acid can facilitate and enhance the removal of AlOx, W and/or TiN on a semiconductor substrate during the etching process.

In some embodiments, the acetic acid is in an amount of at least about 0.01 wt % (e.g., at least about 0.05 wt %, at least about 0.1 wt %, at least about 0.2 wt %, at least about 0.3 wt %, at least about 0.4 wt %, at least about 0.5 wt %, at least about 1 wt %, at least about 1.5 wt %, at least about 2 wt %, at least about 2.2 wt %, at least about 2.4 wt %, at least about 2.5 wt %, at least about 2.6 wt %, at least about 2.8 wt %, at least about 3 wt %, at least about 3.2 wt %) to at most about 4 wt % (e.g., at most about 3.8 wt %, at most about 3.6 wt %, at most about 3.5 wt %, at most about 3.4 wt %, at most about 3.2 wt %, at most about 3 wt %, at most about 2.8 wt %, at most about 2.6 wt %, at most about 2.5 wt %, at most about 2 wt %, at most about 1.5 wt %, at most about 1 wt %, at most about 0.9 wt %, at most about 0.8 wt %, at most about 0.7 wt %, at most about 0.6 wt %, or at most about 0.5 wt %) of the etching compositions of this disclosure. Without wishing to be bound by theory, it is believed that acetic acid can control etching selectivity of AlOx, TiN and W relative to other materials (e.g., high-k or low-k dielectric materials) exposed during the etching process.

In some embodiments, the nitric acid is in an amount of at least about 0.01 wt % (e.g., at least about 0.02 wt %, at least about 0.04 wt %, at least about 0.05 wt %, at least about 0.06 wt %, at least about 0.08 wt %, at least about 0.1 wt %, at least about 0.2 wt %, at least about 0.3 wt %, at least about 0.4 wt %, at least about 0.5 wt %, at least about 1 wt %, at least about 1.5 wt %, at least about 2 wt %, at least about 2.5 wt %, or at least about 3 wt %) to at most about 5 wt % (e.g., at most about 4.5 wt %, at most about 4 wt %, at most about 3.5 wt %, at most about 3 wt %, at most about 2.5 wt %, at most about 2 wt %, at most about 1.6 wt %, at most about 1.5 wt %, at most about 1 wt %, at most about 0.9 wt %, at most about 0.8 wt %, at most about 0.7 wt %, at most about 0.6 wt %, at most about 0.5 wt %, or at most about 0.1 wt %) of the etching compositions of this disclosure. Without wishing to be bound by theory, it is believed that nitric acid can serve as an oxidizer of metals such as TiN and W and can control etching selectivity of TiN and W relative to other materials (e.g., high k or low k dielectric materials) exposed during the etching process. In addition, without wishing to be bound by theory, it is believed that controlling the amounts of acetic acid and nitric acid to a certain ratio (e.g., from about 1.5:1 to 1:1.5 such as 1:1) in an etching composition could adjust the W etch rate over the TiN etch rate to a certain ratio (e.g., about 3:1 to about 4:1). Such an etching composition could be suitable for use in connection with a semiconductor substrate that includes a W layer having a relatively large thickness and a TiN layer having a relatively small thickness.

In some embodiments, the water is in an amount of at least about 10 wt % (e.g., at least about 12 wt %, at least about 14 wt %, at least about 15 wt %, at least about 16 wt %, at least about 18 wt %, at least about 20 wt %, at least about 21 wt %, at least about 22 wt %, at least about 23 wt %, or at least about 24 wt %) to at most about 30 wt % (e.g., at most about 29 wt %, at most about 28 wt %, at most about 27 wt %, at most about 26 wt %, at most about 25 wt %, at most about 23 wt %, at most about 21 wt %, at most about 20 wt %, at most about 19 wt %, at most about 17 wt %, at most about 15 wt %, at most about 13 wt %, or at most about 11 wt %) of the etching compositions of this disclosure.

The etching compositions of this disclosure can optionally include one or more optional metal elements. The metal elements can be in an ionic form (e.g., a metal ion) or a non-ionic form (e.g., a metal such as Sb) in the etching compositions. Examples of suitable metal elements include, but are not limited to, Sb, Cu, K, Ca, Na, Fe, Pb, Sr, As, Ni, Mn, Mg, and Li. In some embodiments, the amount of each metal element can be at least about 0.1 ppb (e.g., at least about 0.5 ppb, at least about 1 ppb, at least about 2 ppb, at least about 4 ppb, at least about 5 ppb, at least about 6 ppb, at least about 8 ppb, at least about 10 ppb, at least about 15 ppb, at least about 20 ppb, at least about 25 ppb, or at least about 30 ppb) to at most about 100 ppb (e.g., at most about 95 ppb, at most about 90 ppb, at most about 80 ppb, at most about 70 ppb, at most about 60 ppb, at most about 50 ppb, at most about 40 ppb, or at most about 30 ppb) of the etching compositions. In some embodiments, the amount of the Sb element is greater than the amount of each of Cu, K, Ca, Na, Fe, Pb, Sr, As, Ni, Mn, Mg, and Li elements. The amount of the metal elements in the etch compositions can generally be measured by using inductively coupled plasma mass spectrometry. In some embodiments, the metal elements are impurities associated with starting materials used to prepare the etching compositions. Without wishing to be bound by theory, it is believed that the metal elements can function as a metal etching inhibitor, which can reduce etching of certain metals exposed during the etching process that are not intended to be etched.

In some embodiments, the etching compositions of this disclosure can optionally include at least one (e.g., two, three, or four) metal corrosion inhibitor. Examples of suitable metal corrosion inhibitors include compounds of formula (A), compounds of formula (B), compounds of formula (C), or substituted tetrazoles:

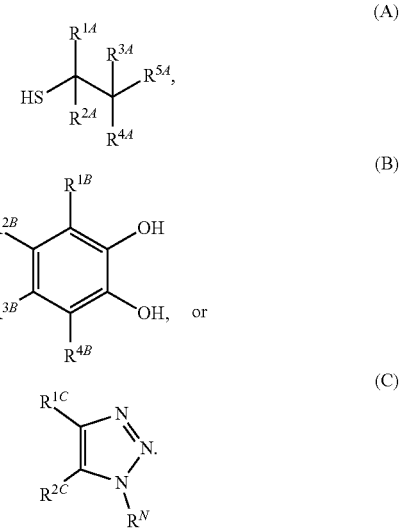

In formula (A), $R^{1A}$ to $R^{5A}$ each independently can be a hydrogen atom, a substituted or unsubstituted hydrocarbon group (e.g., a $C_1$-$C_{10}$ alkyl group), a hydroxyl group, a thiol group, a carboxy group, or a substituted or unsubstituted amino group, provided that at least one group selected from a hydroxyl group, a carboxy group and a substituted or unsubstituted amino group is contained in formula (A). In formula (B), $R^{1B}$ to $R^{4B}$ each independently can be a hydrogen atom, a hydroxyl group, or a substituted or unsubstituted hydrocarbon group (e.g., a $C_1$-$C_{10}$ alkyl group). In formula (C), $R^{1C}$, $R^{2C}$ and $R^N$ each independently can be a hydrogen atom or a substituted or unsubstituted hydrocarbon group (e.g., a $C_1$-$C_{10}$ alkyl group), or $R^{1C}$ and $R^{2C}$, together with the carbon atoms to which they are attached, form a ring (e.g., a 5-membered, 6-membered, or 7-membered ring). The ring can be aromatic or non-aromatic (e.g., containing 0-2 double bonds), and can contain 1-3 optional heteroatoms such as O, N, or S. The ring can optionally be substituted by at least one (e.g., two, three, or four) substituent, such as a hydroxyl group or a substituted or unsubstituted hydrocarbon group (e.g., a $C_1$-$C_{10}$ alkyl group). Examples of suitable metal corrosion inhibitors include thioglycerol, catechol, pyrogallol, benzotriazole, and 5-methylbenzotriazole.

In some embodiments, the metal corrosion inhibitor is in an amount of from at least about 0.0001 wt % (e.g., at least about 0.0002% by weight, at least about 0.0005% by weight, at least about 0.001% by weight, at least about 0.002% by weight, at least about 0.005% by weight, at least about 0.01% by weight, at least about 0.02 by weight, at least about 0.05% by weight, at least about 0.1% by weight, at least about 0.2% by weight, or at least about 0.5% by weight) to at most about 1 wt % (e.g., at most about 0.9 wt %, at most about 0.8 wt %, at most about 0.7 wt %, at most about 0.6 wt %, at most about 0.5 wt %, at most about 0.4 wt %, at most about 0.3 wt %, at most about 0.2 wt %, at most about 0.1 wt %, at most about 0.05 wt %, or at most about 0.01 wt %) of the etching compositions. Without wishing to be bound by theory, it is believed that the metal corrosion inhibitors described above can improve the selectivity of the removal of AlOx, W and/or TiN over other metals (e.g., Cu) on a semiconductor substrate exposed during the etching process.

In some embodiments, the etching compositions of this disclosure can optionally include at least one (e.g., two, three, or four) aluminum etch surfactant. Examples of suitable aluminum etch surfactants include compounds of formula (D): R—N(CH$_3$)$_2$—O (D), in which R is a $C_8$-$C_{24}$ (e.g., $C_{12}$-$C_{18}$) alkyl. One example of a suitable aluminum etch surfactant is n-dodecyl-N,N-dimethylamine-N-oxide:

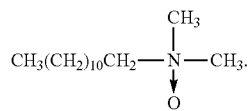

In some embodiments, the aluminum etch surfactant is in an amount of from at least about 0.0001 wt % (e.g., at least about 0.0002% by weight, at least about 0.0005% by weight, at least about 0.001% by weight, at least about 0.002% by weight, at least about 0.005% by weight, at least about 0.01% by weight, at least about 0.02 by weight, at least about 0.05% by weight, at least about 0.1% by weight, at least about 0.2% by weight, or at least about 0.5% by weight) to at most about 1 wt % (e.g., at most about 0.9 wt %, at most about 0.8 wt %, at most about 0.7 wt %, at most about 0.6 wt %, at most about 0.5 wt %, at most about 0.4 wt %, at most about 0.3 wt %, at most about 0.2 wt %, at most about 0.1 wt %, at most about 0.05 wt %, or at most about 0.01 wt %) of the etching compositions. Without wishing to be bound by theory, it is believed that the aluminum etch surfactant can improve the uniformity of a semiconductor surface (e.g., by improving the surface tension of the etching compositions).

In some embodiments, the etching compositions of this disclosure can optionally include a plurality of particles having an average size (e.g., an average diameter) of at least about 0.1 μm (e.g., at least about 0.2 μm, at least about 0.3 μm, at least about 0.4 μm, at least about 0.5 μm, at least about 0.6 μm, or at least about 0.8 μm) to at most about 1 μm (e.g., at most about 0.9 μm, at most about 0.8 μm, at most about 0.7 μm, at most about 0.6 μm, at most about 0.5 μm, at most about 0.4 μm, at most about 0.2 μm). In some embodiments, the plurality of particles are in an amount of at most about 150 counts/ml (e.g., at most about 125 counts/ml, at most about 100 counts/ml, at most about 90 counts/ml, at most about 80 counts/ml, at most about 70 counts/ml, at most about 60 counts/ml, at most about 50 counts/ml, at most about 40 counts/ml, at most about 30 counts/ml, at most about 20 counts/ml, or at most about 10 counts/ml) and/or 0 counts/ml (e.g., at least about 5 counts/ml) of the etching compositions. In general, the particle size and particle count can be measured by using a particle counter such as Rion KS-42B, In some embodiments, the particles are impurities associated with starting materials used to prepare the etching compositions. Without wishing to be bound by theory, it is believed that including a suitable amount (e.g., 10-100 counts/ml) of the particles in the etching compositions described herein can inhibit unusual etching, such as pitting or spearhead etching. On the other hand, without wishing to be bound by theory, it is believed that including more than 100 counts/ml of the particles in an etching composition may produce defects on the surface of the semiconductor substrate.

In some embodiments, the etching compositions of this disclosure can have a pH of at most about 1 (e.g., at most about 0.9, at most about 0.8, at most about 0.7, at most about 0.6, or at most about 0.5) and/or at least about 0 (e.g., at least about 0.1, at least about 0.2, at least about 0.3, at least about 0.4, or at least about 0.5). Without wishing to be bound by theory, it is believed that an etching compositions having a pH higher than 1 would not have sufficient AlOx, W and/or TiN etch rates as a sufficiently high acidity is needed to remove these materials, and an etching composition having a pH lower than 0 could decompose certain components in the composition due to strong acidity.

In addition, in some embodiments, the etching compositions of the present disclosure may contain optionally additives such as, pH adjusting agents, additional corrosion inhibitors, additional surfactants, organic solvents, biocides, and defoaming agents. Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Examples of suitable surfactants may be cationic, anionic, nonionic or amphoteric.

In general, the etching compositions of the present disclosure can have a relatively high W/dielectric material and/or TiN/dielectric material etch selectivity (i.e., a high ratio of W etch rate over dielectric material etch rate and/or a high ratio of TiN etch rate over dielectric material etch rate). Examples of dielectric materials include $SiO_2$, AlOx, high-k dielectric materials, and low-k dielectric materials. In some embodiments, the etching composition can have a W/dielectric material and/or TiN/dielectric material etch selectivity of at least about 2 (e.g., at least about 3, at least about 4, at least about 5, at least about 6, at least about 7, at least about 8, at least about 9, at least about 10, at least about 15, at least about 20, at least about 30, at least about 40, or at least about 50) and/or at most about 500 (e.g., at most about 100).

In some embodiments, the etching compositions of the present disclosure can have a relatively high AlOx/W and/or AlOx/TiN etch selectivity (i.e., a high ratio of AlOx etch rate over W etch rate and/or a high ratio of AlOx etch rate over TiN etch rate). In some embodiments, the etching compositions can have a AlOx/W and/or AlOx/TiN etch selectivity of at least about 2 (e.g., at least about 3, at least about 4, at least about 5, at least about 6, at least about 7, at least about 8, at least about 9, at least about 10, at least about 15, at least about 20, at least about 30, at least about 40, or at least about 50) and/or at most about 500 (e.g., at most about 200 or at most about 100). Such etching compositions can be suitable for use in connection with a semiconductor that includes an AlOx layer having a relatively large thickness and a W or TiN layer having a relatively small thickness.

In some embodiments, the etching compositions of the present disclosure may specifically exclude (or are substantially free from) one or more of the additive components, in any combination, if more than one. As used herein, the term "substantially free" refers to the weight % of a component being at most about 0.1% (e.g., at most about 0.05%, at most about 0.01%, at most about 0.005%, at most about 0.001%, or about 0%) of the etching compositions. Such excluded components are selected from the group consisting of polymers, oxygen scavengers, quaternary ammonium salts (including quaternary ammonium hydroxides), amines, alkaline bases (such as NaOH, KOH, and LiOH), surfactants other than a defoamer, a defoamer, fluoride containing compounds, oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives (e.g., silica or alumina abrasives), silicates, hydroxycarboxylic acids containing more than two hydroxyl groups, carboxylic and polycarboxylic acids (e.g., those lacking amino groups), sulfonic acid, silanes (e.g., alkoxysilanes), cyclic compounds (e.g., cyclic compounds containing at least two rings, such as substituted or unsubstituted naphthalenes, or substituted or unsubstituted biphenylethers), chelating agents, buffering agents, non-azole corrosion inhibitors, azoles (e.g., diazoles, triazoles, or tetrazoles), and salts (e.g., sulfate salts, sulfonate salts, chloride salts, nitrate salts, acetate salts, phosphate salts, and metal salts such as metal halides, potassium salts (e.g., potassium nitrate), sodium salts, and silver salts).

The etching composition of this disclosure can be prepared by simply mixing the components together, or may be prepared by blending two compositions in a kit. The first composition in the kit can be an aqueous solution of nitric acid. The second composition in the kit can contain the remaining components of the etching compositions of this disclosure at predetermined ratios in a concentrated form such that the blending of the two compositions will yield a desired etching composition of the disclosure.

In some embodiments, the present disclosure features a method of etching a semiconductor substrate containing AlOx, W and/or TiN (e.g., features containing AlOx, W and/or TiN). The method includes contacting a semiconductor substrate containing AlOx, W and/or TiN with an etching composition of this disclosure to remove AlOx, W and/or TiN. The contacting can be performed at a temperature of at least about 20° C. (e.g., at least about 25° C., at least about 30° C., at least about 40° C., at least about 50° C., or at least about 60° C.) and/or at most about 95° C. (e.g., at most about 90° C., at most about 80° C., or at most about 70° C.). The method can further include rinsing the semiconductor substrate with a rinse solvent after the contacting step and/or drying the semiconductor substrate after the rinsing step. In some embodiments, the method does not substantially remove Cu or a dielectric material (e.g., $SiO_2$) in the semiconductor substrate. For example, the method does not remove more than about 5% by weight (e.g., more than about 3% by weight or more than about 1% by weight) of Cu or a dielectric material in the semiconductor substrate.

In some embodiments, the etching method includes the steps of:

(A) providing a semiconductor substrate containing AlOx, W and/or TiN;

(B) contacting the semiconductor substrate with an etching composition described herein;

(C) rinsing the semiconductor substrate with one or more suitable rinse solvents; and (D) optionally, drying the semiconductor substrate (e.g., by any suitable means that removes the rinse solvent and does not compromise the integrity of the semiconductor substrate).

The semiconductor substrates containing AlOx, W and/or TiN to be etched in this method can contain organic and organometallic residues, and additionally, a range of metal oxides that may also be removed during the etching process.

Semiconductor substrates typically are constructed of silicon, silicon germanium, Group III-V compounds such as GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrate may also contain layers of interlayer dielectrics, silicon oxide, silicon nitride, silicon carbide, titanium oxide, and carbon doped silicon oxides.

The semiconductor substrate can be contacted with the etching compositions described herein by any suitable method, such as placing an etching composition into a tank and immersing and/or submerging the semiconductor substrate into the etching composition, spraying an etching composition onto the semiconductor substrate, streaming an etching composition onto the semiconductor substrate, or any combinations thereof.

The etching compositions of the present disclosure can be effectively used up from room temperature (e.g., about 20-25° C.) to a temperature of about 95° C. (e.g., from about 55° C. to about 95° C., from about 60° C. to about 90° C., from about 60° C. to about 80° C., or about 70° C.). The etch rates of AlOx, W and/or TiN generally increase with temperature in this range, thus the processes with higher temperature can be run for shorter times. Conversely, lower etching temperatures typically require longer etching times. In some embodiments, inventors surprisingly found that the etching compositions described in this disclosure can have a significantly higher increase in the AlOx etch rate at an elevated temperature (e.g., at 70° C.) compared to the increases in the W or TiN etch rate, thereby resulting in a relatively high AlOx/W or AlOx/TiN etch selectivity at that temperature.

Etching times can vary over a wide range depending on the particular etching method, thickness, and temperature employed. When etching in an immersion batch type process, a suitable time range is, for example, up to about 10 minutes (e.g., from about 1 minute to about 7 minutes, from about 1 minute to about 5 minutes, or from about 2 minutes to about 4 minutes). Etching times for a single wafer process can range from about 30 seconds to about 5 minutes (e.g., from about 30 seconds to about 4 minutes, from about 1 minute to about 3 minutes, or from about 1 minute to about 2 minutes).

To further promote the etching ability of the etching compositions of the present disclosure, mechanical agitation means can be employed. Examples of suitable agitation means include circulation of an etching composition over the substrate, streaming or spraying an etching composition over the substrate, and ultrasonic or megasonic agitation during the etching process. The orientation of the semiconductor substrate relative to the ground can be at any angle. Horizontal or vertical orientations are preferred.

Subsequent to the etching, the semiconductor substrate can be rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, or in addition, aqueous rinses with pH>8 (such as dilute aqueous ammonium hydroxide) can be employed. Examples of rinse solvents include, but are not limited to, dilute aqueous ammonium hydroxide, DI water, methanol, ethanol, and isopropyl alcohol. The rinse solvent can be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

In some embodiments, the etching method described herein further includes forming a semiconductor device (e.g., an integrated circuit device such as a semiconductor chip) from the semiconductor substrate obtained by the method described above.

The present disclosure is illustrated in more detail with reference to the following examples, which are for illustrative purposes and should not be construed as limiting the scope of the present disclosure.

EXAMPLES

Any percentages listed are by weight (wt %) unless otherwise specified. Controlled stirring during testing was done with a 1 inch stirring bar at 300 rpm unless otherwise noted.

General Procedure 1

Formulation Blending

Samples of etching compositions were prepared by adding, while stirring, to the calculated amount of water the remaining components of the formulation. After a uniform solution was achieved, optional additives, if used, were added.

General Procedure 2

Materials and Methods

Blanket film etch rate measurements on films were carried out using commercially available unpatterned 300 mm diameter wafers that were diced into 0.5"×0.5" test coupons for evaluation. Primary blanket film materials used for testing include 1) a W film of about 1000 Å thickness deposited on a silicon substrate; 2) an TiN film of about 1000 Å thickness deposited on a silicon substrate, 3) a HfOx film of about 250 Å thickness deposited on 1000 Å $SiO_2$ on a silicon substrate; 4) a AlOx film of about 250 Å thickness deposited on 1000 Å $SiO_2$ on a silicon substrate.

The blanket film test coupons were measured for pre-treatment and post-treatment thickness to determine blanket film etch rates. For the W and TiN metal blanket films, the film thickness was measured by sheet resistance using a CDE Resimap 273, 4-point probe. For the HfOx and AlOx films, the film thicknesses were measured pre-treatment and post-treatment by Ellipsometry using a Woollam M-2000X.

General Procedure 3

Etching Evaluation with Beaker Test

All blanket film etch testing was carried out at room temperature (21-23° C.; unless otherwise specified below) in a 600 mL glass beaker containing 200 g of a sample solution with continuous stirring at 250 rpm, with the Parafilm® cover in place at all times to minimize evaporative losses. All blanket test coupons having a blanket metal or dielectric film exposed on one side to the sample solution were diced by diamond scribe into 0.5"×0.5" square test coupon size for beaker scale testing. Each individual test coupon was held into position using a single 4" long, locking plastic tweezers clip. The test coupon, held on one edge by the locking tweezers clip, was suspended into the 600 mL glass beaker and immersed into the 200 g test solution while the solution was stirred continuously at 250 rpm at room temperature. Immediately after each sample coupon was placed into the stirred solution, the top of the 600 mL glass beaker was covered and resealed with Parafilm®. The test coupons were held static in the stirred solution until the treatment time (as described in General Procedures 3A) had elapsed. After the treatment time in the test solution had elapsed, the sample coupons were immediately removed from the 600 mL glass beaker and rinsed according to General Procedure 3A. After the final DI rinse step, all test coupons were subject to a filtered nitrogen gas blow off step using a hand held nitrogen gas blower which forcefully removed all traces of DI water to produce a final dry sample for test measurements.

General Procedure 3A (Blanket Test Coupons)

Immediately after a treatment time of 10 minutes according to General Procedure 3, the coupon was immersed in a 1000 mL volume of ultra-high purity deionized (DI) water with ~1 liter/min overflow rate at 20° C. for 30 seconds and then for an additional 30 seconds with mild agitation. The processing was completed according to General Procedure 3.

Example 1

Formulation Examples 1-4 (FE-1 to FE-4) were prepared according to General Procedure 1, and evaluated according to General Procedures 2 and 3. The formulations and the test results are summarized in Table 1.

TABLE 1

| Composition [wt %] | FE-1 | FE-2 | FE-3 | FE-4 |
|---|---|---|---|---|
| Phosphoric acid | 80.21% | 76.21% | 74.69% | 73.17% |
| Acetic acid | 3.33% | 3.33% | 3.33% | 3.33% |
| Nitric acid | 0.1% | 0.1% | 1.62% | 3.14% |
| Water | 16.36% | 20.36% | 20.36% | 20.36% |
| Total | 100.00% | 100.00% | 100.00% | 100.00% |
| Test conditions and results | | | | |
| Etch temperature (° C.) | 87 | 87 | 87 | 87 |
| Etch time (s) | 600 | 600 | 600 | 600 |
| TiN etch rate (Å/minute) | 50.5 | 60.9 | 61 | 73 |
| W etch rate (Å/minute) | 42.4 | 81.4 | 74.7 | 95.6 |
| Ratio of TiN/W | 1.2 | 0.7 | 0.8 | 0.8 |

As shown in Table 1, FE-2 exhibited an improved TiN and W etch rates compared to FE-1 as the amount of water increased from FE-1 to FE-2. In addition, as the amount of nitric acid increased from FE-2 to FE-4, the TiN and W etch rates also increased.

Example 2

Formulation Examples 5-8 (FE-5 to FE-8) were prepared according to General Procedure 1, and evaluated according to General Procedures 2 and 3. The formulations and the test results are summarized in Table 2.

TABLE 2

| Composition [wt %] | FE-5 | FE-6 | FE-7 | FE-8 |
|---|---|---|---|---|
| Phosphoric acid | 82.05% | 79.21% | 78.21% | 77.21% |
| Acetic acid | 3.33% | 3.33% | 3.33% | 3.33% |
| Nitric add | 0.1% | 0.1% | 0.1% | 0.1% |
| Water | 14.52% | 17.36% | 18.36% | 19.36% |
| Total | 100.00% | 100.00% | 100.00% | 100.00% |
| Test conditions and results | | | | |
| Etch temperature (° C.) | 87 | 87 | 87 | 87 |
| Etch time (s) | 555 | 555 | 455 | 400 |
| TiN etch rate (Å/minute) | 38.6 | 38.3 | 68.8 | 69.2 |
| W etch rate (Å/minute) | 30.7 | 35 | 59.3 | 64.2 |
| Ratio of TiN/W | 1.3 | 1.1 | 1.2 | 1.1 |

As shown in Table 2, as the amount of water increased from FE-5 to FE-8, the TiN and W etch rates also increased.

Example 3

Formulation Examples 9-12 (FE-9 to FE-12) were prepared according to General Procedure 1, and evaluated according to General Procedures 2 and 3. The formulations and the test results are summarized in Table 3.

TABLE 3

| Composition [wt %] | FE-9 | FE-10 | FE-11 | FE-12 |
|---|---|---|---|---|
| Phosphoric acid | 76.31% | 76.01% | 75.71% | 77.71% |
| Acetic acid | 3.33% | 3.33% | 3.33% | 3.33% |
| Nitric acid | 0% | 0.3% | 0.6% | 0.6% |
| Water | 20.36% | 20.36% | 20.36% | 18.36% |
| Total | 100.00% | 100.00% | 100.00% | 100.00% |
| Test conditions and results | | | | |
| Etch temperature (° C.) | 87 | 87 | 87 | 87 |
| Etch time (s) | 345 | 345 | 345 | 555 |
| TN etch rate (Å/minute) | 1.8 | 70.9 | 78.4 | 65.6 |
| W etch rate (Å/minute) | 0.7 | 77.8 | 86.1 | 55.4 |
| Ratio of TiN/W | 2.7 | 0.9 | 0.9 | 1.2 |

As shown in Table 3, when nitric acid is absent, FE-9 exhibited very low TiN and W etch rates. In addition, as the amount of nitric acid increased from FE-10 to FE-11, the TiN and W etch rates also increased. Further, as the amount of water decreased from FE-11 to FE-12, the TiN and W etch rates decreased.

While the invention has been described in detail with reference to certain embodiments thereof, it will be understood that modifications and variations are within the spirit and scope of that which is described and claimed.

Example 4

Formulation Examples 13-19 (FE-13 to FE-19) were prepared according to General Procedure 1, and evaluated according to General Procedures 2 and 3. The formulations and the test results are summarized in Table 4.

TABLE 4

| Component | Units | FE-13 | FE-14 | FE-15 | FE-16 | FE-17 | FE-18 | FE-19 |
|---|---|---|---|---|---|---|---|---|
| Cu | PPB | 2.7 | 0.0 | 4.2 | 6.0 | 11.4 | 0.0 | 0.0 |
| K | PPB | 3.4 | 0.6 | 10.5 | 0.0 | 2.1 | 0.3 | 0.1 |
| Ca | PPB | 5.2 | 5.3 | 11.0 | 10.2 | 4.3 | 4.5 | 2.7 |
| Na | PPB | 43.2 | 0.1 | 17.9 | 19.0 | 17.4 | 0.0 | 18.4 |
| Fe | PPB | 0.0 | 1.1 | 19.3 | 9.5 | 21.0 | 9.3 | 28.2 |
| Pb | PPB | 0.1 | 0.0 | 0.0 | 0.1 | 0.1 | 0.0 | 0.0 |
| Sb | PPB | 22.7 | 40.3 | 34.7 | 47.4 | 108.0 | <1 | 24.2 |
| Sr | PPB | 0.0 | 0.0 | 0.0 | 0.0 | 0.0 | 0.0 | 0.0 |
| As | PPB | 0.0 | 0.0 | 0.0 | 0.0 | 0.0 | 0.0 | 0.0 |

TABLE 4-continued

| Component | Units | FE-13 | FE-14 | FE-15 | FE-16 | FE-17 | FE-18 | FE-19 |
|---|---|---|---|---|---|---|---|---|
| Ni | PPB | 2.5 | 4.5 | 2.9 | 4.5 | 3.9 | 4.4 | 5.7 |
| Mn | PPB | 1.9 | 0.0 | 0.0 | 2.2 | 1.3 | 2.5 | 0.0 |
| Mg | PPB | 2.0 | 0.1 | 1.2 | 0.0 | 0.0 | 0.0 | 0.8 |
| Li | PPB | 1.1 | 0.0 | 1.1 | 0.0 | 0.0 | 0.1 | 0.2 |
| $H_2O$ | wt % | 20.16 | 20.67 | 20.54 | 20.02 | 20.34 | 20.83 | 20.11 |
| $H_3PO_4$ | wt % | 73.22 | 73.03 | 72.81 | 73.87 | 73.38 | 72.87 | 73.32 |
| $HNO_3$ | wt % | 3.19 | 3.13 | 3.30 | 3.04 | 3.08 | 3.20 | 3.24 |
| HAc | wt % | 3.43 | 3.18 | 3.35 | 3.07 | 3.20 | 3.10 | 3.33 |
| HfOx etch rate (Å/minute) | | 3.3 | 1.1 | 2.6 | 0.9 | 3.1 | 2.9 | 2.8 |

As shown in Table 4, when the amount of Sb increased in FE-13 to FE16, the HfOx etching rate decreased. In addition, when the amount of Sb was higher than 100 ppb (in FE-17) or lower than 1 ppb (in FE-18), the formulations exhibited relatively high HfOx etching rates. Without wishing to be bound by theory, it is believed that Sb can form an insoluble passivation layer on HfOx surface, thereby reducing its etch rate during an etching process.

Example 5

Formulation Examples 20-27 (FE-20 to FE-27) were prepared according to General Procedure 1, and evaluated according to General Procedures 2 and 3. The formulations and the test results are summarized in Table 5. The formulation and test results of FE-2 are also included in Table 5 as a comparison.

TABLE 5

| Composition [wt %] | FE-2 | FE-20 | FE-21 | FE-22 | FE-23 | FE-24 | FE-25 | FE-26 | FE-27 |
|---|---|---|---|---|---|---|---|---|---|
| Phosphoric acid | 76.21% | 76.11% | 75.71% | 76.01% | 76.16% | 76.21% | 74.71% | 76.21% | 74.71% |
| Acetic acid | 3.33% | 3.33% | 3.33% | 3.33% | 3.33% | 3.33% | 3.33% | 3.33% | 3.33% |
| Nitric acid | 0.10% | 0.10% | 0.10% | 0.10% | 0.10% | 0.10% | 0.10% | 0.10% | 0.10% |
| thiogycerol | | 0.10% | | | | | | | |
| benzotriazole | | | 0.50% | | | 0.00005% | 1.50% | | |
| Catechol | | | | 0.20% | | | | | |
| n-Dodecyl-N,N-Dimethylamine-N-Oxide | | | | | 0.05% | | | 0.00005% | 1.50% |
| Water | 20.36% | 20.36% | 20.36% | 20.36% | 20.36% | 20.36% | 20.36% | 20.36% | 20.36% |
| Total | 100% | 100% | 100% | 100% | 100% | 100% | 100% | 100% | 100% |
| Test conditions and results | | | | | | | | | |
| Etch temperature (° C.) | 87 | 87 | 87 | 87 | 87 | 87 | 87 | 87 | 87 |
| TiN etch rate (Å/minute) | 60.9 | 55.8 | 56.1 | 59.1 | 60.1 | 60.0 | 53.2 | 60.4 | 55.4 |
| W etch rate (Å/minute) | 81.4 | 61.7 | 54.3 | 66.4 | 78.9 | 77.4 | 44.5 | 73.2 | 75.6 |
| Ratio of TiN/W | 0.7 | 0.9 | 1.0 | 0.9 | 0.8 | 0.8 | 1.2 | 0.8 | 0.7 |

As shown in Table 5, when certain additives (e.g., metal corrosion inhibitors and aluminum etch surfactants) were added, the ratio of TiN/W etch rate improved and became close to 1.

Example 6

Formulation Examples 28-32 (FE-28 to FE-32) were prepared according to General Procedure 1, and evaluated according to General Procedures 2 and 3. The formulations and the test results are summarized in Table 6.

TABLE 6

| Component | Units | FE-28 | FE-29 | FE-30 | FE-31 | FE-32 |
|---|---|---|---|---|---|---|
| $H_2O$ | wt % | 20.08 | 20.16 | 20.37 | 20.40 | 20.96 |
| $H_3PO_4$ | wt % | 73.62 | 73.22 | 73.06 | 72.98 | 72.57 |
| $HNO_3$ | wt % | 3.04 | 3.19 | 3.34 | 3.31 | 3.26 |
| HAc | wt % | 3.26 | 3.43 | 3.23 | 3.31 | 3.21 |
| PC at 0.5 micron | cnt/ml | 3.2 | 21.2 | 46.6 | 79.8 | 112.0 |
| Unusual etching (spearhead) | | 3 | 3 | 2 | 1 | 1 |

Rating of unusual etching (spearhead):
1. No spearhead (<1%)
2. Few spearhead (<3%)
3. Some spearhead (<5%)
4. Poor spearhead (over 10%)

As shown in Table 6, when 0.5 micron size particles were present and their amounts increased, the formulations exhibited reduced unusual etching such as spearhead.

Example 7

Formulation Examples 33-39 (FE-33 to FE-39) were prepared according to General Procedure 1, and evaluated according to General Procedures 2 and 3. The formulations and the test results are summarized in Table 7. The formulation and test results of FE-2 are also included in Table 7 as a comparison.

TABLE 7

| Component | Units | FE-2 | FE-33 | FE-34 | FE-35 | FE-36 | FE-37 | FE-38 | FE-39 |
|---|---|---|---|---|---|---|---|---|---|
| $H_2O$ | wt % | 20.36 | 23.7 | 8.7 | 21.32 | 19.22 | 23.26 | 21.54 | 17.78 |
| $H_3PO_4$ | wt % | 76.21 | 70 | 85 | 73.62 | 73.62 | 73.62 | 73.62 | 78.12 |
| $HNO_3$ | wt % | 0.10 | 3.04 | 3.04 | 1.8 | 3.9 | 3.04 | 3.04 | 2.80 |
| HAc | wt % | 3.33 | 3.26 | 3.26 | 3.26 | 3.26 | 0.08 | 1.8 | 1.30 |
| Unusual etching (spearhead) | | 1 | 2 | 2 | 2 | 2 | 2 | 2 | 1 |

As shown in Table 7, the weight percentages $H_3PO_4$, $HNO_3$ and HAc are important to control spearhead.

Comparative Example

Comparative Formulation Examples CFE-1 to CFE-6 were prepared according to General Procedure 1, and evaluated according to General Procedures 2 and 3. The formulations and the test results are summarized in Table 8. The formulation and test results of FE-2 are also included in Table 8 as a comparison.

TABLE 8

| Component | Units | FE-2 | CFE-1 | CFE-2 | CFE-3 | CFE-4 | CFE-5 | CFE-6 |
|---|---|---|---|---|---|---|---|---|
| $H_2O$ | wt % | 20.36 | 5.14 | 34.14 | 23.119 | 17.62 | 26.279 | 21.78 |
| $H_3PO_4$ | wt % | 76.21 | 91.5 | 62.5 | 73.62 | 73.62 | 73.62 | 73.62 |
| $HNO_3$ | wt % | 0.10 | 0.10 | 0.10 | 0.001 | 5.5 | 0.10 | 0.10 |

TABLE 8-continued

| Component | Units | FE-2 | CFE-1 | CFE-2 | CFE-3 | CFE-4 | CFE-5 | CFE-6 |
|---|---|---|---|---|---|---|---|---|
| HAc | wt % | 3.33 | 3.26 | 3.26 | 3.26 | 3.26 | 0.001 | 4.5 |
| Unusual etching (spearhead) | | 1 | 4 | 4 | 4 | 4 | 4 | 4 |

As shown in Table 8, the unusual etching rate was poor when (1) the weight percentage of $H_3PO_4$ was higher than 90% or lower than 65% (see CFE-1 and CFE-2, respectively), (2) the weight percentage of $HNO_3$ was lower than 0.01% and higher than 5% (see CFE-3 and CFE-4, respectively), and (3) the weight percentage of HAc was lower than 0.01% and higher than 4% (see CFE-5 and CFE-6, respectively).

Example 8

Formulation Examples 40-57 (FE-40 to FE-57) were prepared according to General Procedure 1, and evaluated according to General Procedures 2 and 3. The etching test was performed at 70° C. The formulations and the test results are summarized in Table 9.

TABLE 9

| Ex. | $H_3PO_4$ (wt %) | HAc (wt %) | $HNO_3$ (wt %) | $H_2O$ (wt %) | Total (wt %) | W etch rate (Å/min) | $Al_2O_3$ etch rate (Å/min) | TiN etch rate (Å/min) |
|---|---|---|---|---|---|---|---|---|
| FE-40 | 73% | 0.4% | 0.4% | 26.2% | 100% | 33.5 | 816.6 | 10.9 |
| FE-41 | 73% | 0.4% | 0.5% | 26.1% | 100% | 33.3 | 877.9 | 11.9 |
| FE-42 | 73% | 0.4% | 0.6% | 26% | 100% | 32.5 | 865.2 | 11.65 |
| FE-43 | 73% | 0.5% | 0.4% | 26.1% | 100% | 41.1 | 903 | 11.5 |
| FE-44 | 73% | 0.5% | 0.5% | 26% | 100% | 37.3 | 852 | 10.7 |
| FE-45 | 73% | 0.5% | 0.6% | 25.9% | 100% | 31.3 | 811.8 | 10.7 |
| FE-46 | 73% | 0.6% | 0.4% | 26% | 100% | 33.5 | 759 | 8.05 |
| FE-47 | 73% | 0.6% | 0.5% | 25.9% | 100% | 27.1 | 699 | 8.25 |
| FE-48 | 73% | 0.6% | 0.6% | 25.8% | 100% | 30.6 | 697.2 | 8.85 |
| FE-49 | 75% | 0.4% | 0.4% | 24.2% | 100% | 32.1 | 1047.6 | 9.5 |
| FE-50 | 75% | 0.4% | 0.5% | 24.1% | 100% | 28.2 | 993.6 | 11.05 |
| FE-51 | 75% | 0.4% | 0.6% | 24% | 100% | 32.6 | 1165.8 | 11.7 |
| FE-52 | 75% | 0.5% | 0.4% | 24.1% | 100% | 26 | 990 | 11.2 |
| FE-53 | 75% | 0.5% | 0.5% | 24% | 100% | 26 | 1066.2 | 10.8 |
| FE-54 | 75% | 0.5% | 0.6% | 23.9% | 100% | 28.4 | 989.4 | 11.35 |
| FE-55 | 75% | 0.6% | 0.4% | 24% | 100% | 28.7 | 914.4 | 12.9 |
| FE-56 | 75% | 0.6% | 0.5% | 23.9% | 100% | 25.2 | 934.8 | 11.05 |
| FE-57 | 75% | 0.6% | 0.6% | 23.8% | 100% | 24.5 | 852.6 | 11.2 |

As shown in Table 9, FE-40 to FE-57 exhibited high $Al_2O_3$ etch rates, as well as high $Al_2O_3$/W and $Al_2O_3$/TiN etch selectivity, at the etch temperature of 70° C.

Example 9

Formulation Example 58 (FE-58) was prepared according to General Procedure 1, and evaluated according to General Procedures 2 and 3 at different etching temperatures (i.e., 25° C., 50° C., and 70° C.) after aging after a certain period of time (i.e., 1 hour, 4 hours, 8 hours, or 24 hours). FE-58 contained 74 wt % phosphoric acid, 0.5 wt % acetic acid, 0.5 wt % nitric acid, and 25 wt % water. The test results are summarized in Table 10.

TABLE 10

|  | Bath Aging Time | | | |
| --- | --- | --- | --- | --- |
|  | 1-Hr Bath Aging A/min | 4-Hr Bath Aging A/min | 8-Hr Bath Aging A/min | 24-Hr Bath Aging A/min |
| Etch Rate (25° C.) | | | | |
| W | 0.3 | 0.3 | 0 | 0 |
| $Al_2O_3$ | 5 | 11.4 | 14 | 10.4 |
| TiN | 0.3 | 0.3 | 0.4 | 0.4 |
| Etch Rate (50° C.) | | | | |
| W | 3.4 | 3.8 | 3.2 | 5.3 |
| $Al_2O_3$ | 190.6 | 180.2 | 190.4 | 234.2 |
| TiN | 2.3 | 2.5 | 2.6 | 2.4 |
| Etch Rate (70° C.) | | | | |
| W | 30.7 | 32.5 | 32.7 | 30.5 |
| $Al_2O_3$ | 838.2 | 839.8 | 816.4 | 1000.2 |
| TiN | 11 | 13.1 | 11.4 | 11.7 |

As shown in Table 10, an increase in the etch temperature from 25° C. to 70° C. increased the etch rates of all three tested materials (i.e., W, $Al_2O_3$, and TiN). In addition, an increase in the etch temperature from 25° C. to 70° C. resulted in a larger increase in the $Al_2O_3$ etch rate than the W and TiN etch rates, which in turn resulted in a higher $Al_2O_3$/W and $Al_2O_3$/TiN etch selectivity.

What is claimed is:

1. A method, comprising:
   contacting a semiconductor substrate containing W with an etching composition to remove the W, the etching composition comprising:
   phosphoric acid in an amount of from about 65 wt % to about 77 wt % or from about 80 wt % to about 85 wt % of the composition;
   acetic acid in an amount of from about 0.02 wt % to about 3 wt % of the composition;
   nitric acid in an amount of from about 1 wt % to about 3.5 wt % of the composition; and
   water;
   wherein the composition is free of a potassium salt and a sodium salt; and
   wherein the composition has a pH of at most about 1.

2. The method of claim 1, further comprising rinsing the semiconductor substrate with a rinse solvent after the contacting step.

3. The method of claim 2, further comprising drying the semiconductor substrate after the rinsing step.

4. The method of claim 1, wherein the method does not substantially remove Cu or a dielectric material on the semiconductor substrate.

5. The method of claim 1, wherein the phosphoric acid is in an amount of from about 70 wt % to about 77 wt % and from about 80 wt % to about 85 wt % of the composition.

6. The method of claim 1, wherein the phosphoric acid is in an amount of from about 72 wt % to about 76 wt % of the composition.

7. The method of claim 1, wherein the acetic acid is in an amount of from about 0.3 wt % to about 0.7 wt % of the composition.

8. The method of claim 1, wherein the water is in an amount of from about 10 wt % to about 30 wt % of the composition.

9. The method of claim 1, wherein the composition further comprises Sb.

10. The method of claim 9, wherein the Sb is in an amount of from about 1 ppb to about 100 ppb of the composition.

11. The method of claim 9, wherein the composition further comprises one or more metal elements selected from the group consisting of Cu, Ca, Fe, Pb, Sr, As, Ni, Mn, Mg, and Li.

12. The method of claim 11, wherein the amount of the Sb is greater than the amount of each of Cu, Ca, Pb, Sr, As, Ni, Mn, Mg, and Li.

13. The method of claim 11, wherein the amount of the Sb is greater than the amount of Fe.

14. The method of claim 1, wherein the composition further comprises at least one metal corrosion inhibitor.

15. The method of claim 14, wherein the at least one metal corrosion inhibitor comprises a compound of formula (A), a compound of formula (B), a compound of formula (C), or a substituted tetrazole:

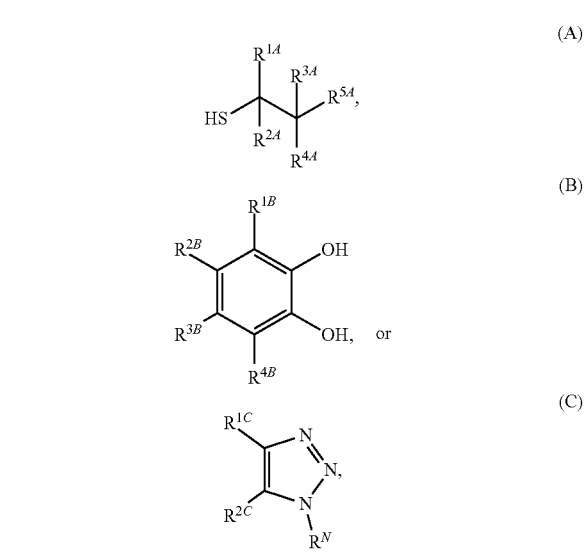

wherein
   $R^{1A}$ to $R^{5A}$ each independently is a hydrogen atom, a substituted or unsubstituted hydrocarbon group, a hydroxyl group, a thiol group, a carboxy group, or a substituted or unsubstituted amino group, provided that at least one group selected from a hydroxyl group, a carboxy group and a substituted or unsubstituted amino group is contained in formula (A);
   $R^{1B}$ to $R^{4B}$ each independently is a hydrogen atom, a hydroxyl group, or a substituted or unsubstituted hydrocarbon group; and $R^{1C}$, $R^{2C}$ and $R^N$ each independently is a hydrogen atom or a substituted or unsubstituted hydrocarbon group, or $R^{1C}$ and $R^{2C}$, together with the carbon atoms to which they are attached, form a ring.

16. The method of claim 14, wherein the at least one metal corrosion inhibitor is in an amount of from about 0.0001 wt % to about 1 wt % of the composition.

17. The method of claim 1, wherein the composition further comprises a plurality of particles having an average size of from about 0.1 µm to about 1 µm.

18. The method of claim 17, wherein the plurality of particles are in an amount of at most about 150 counts/ml of the composition.

19. The method of claim 1, wherein the composition further comprises at least one aluminum etch surfactant.

20. The method of claim 19, wherein the at least one aluminum etch surfactant comprise a compound of formula (D): R—N(CH$_3$)$_2$—O (D), in which R is a $C_8$-$C_{24}$ alkyl.

21. The method of claim 19, wherein the at least one aluminum etch surfactant is in an amount of from about 0.0001 wt % to about 1 wt % of the composition.

22. The method of claim 1, wherein the composition consists of the phosphoric acid, acetic acid, nitric acid, and water.

23. The method of claim 1, wherein the semiconductor substrate further comprises AlOx.

\* \* \* \* \*

UNITED STATES PATENT AND TRADEMARK OFFICE
CERTIFICATE OF CORRECTION

PATENT NO. : 12,104,108 B2
APPLICATION NO. : 17/102961
DATED : October 1, 2024
INVENTOR(S) : Tomonori Takahashi and Frank Gonzalez It is certified that error appears in the above-identified patent and that said Letters Patent is hereby corrected as shown below:

In the Claims

Column 19
Line 52, in Claim 1, delete "0.02" and insert -- 0.2 --

Signed and Sealed this
Twelfth Day of November, 2024

Katherine Kelly Vidal
*Director of the United States Patent and Trademark Office*